(12) United States Patent
Griswold et al.

(10) Patent No.: US 8,773,129 B2
(45) Date of Patent: Jul. 8, 2014

(54) COMBINED CORRELATION PARAMETER ANALYSIS

(76) Inventors: Mark Griswold, Shaker Heights, OH (US); Nicole Seiberlich, Shaker Heights, OH (US)

( * ) Notice: Subject to any disclaimer, the term of this patent is extended or adjusted under 35 U.S.C. 154(b) by 496 days.

(21) Appl. No.: 13/085,753

(22) Filed: Apr. 13, 2011

(65) Prior Publication Data

US 2012/0262166 A1 Oct. 18, 2012

(51) Int. Cl.
*G01R 33/48* (2006.01)
*G01R 33/50* (2006.01)
*G01R 33/561* (2006.01)

(52) U.S. Cl.
CPC ............ *G01R 33/50* (2013.01); *G01R 33/5611* (2013.01); *G01R 33/5614* (2013.01)
USPC .......................................... 324/309; 324/307

(58) Field of Classification Search
CPC ....................................................... G01R 33/50
USPC .................................................. 324/307–309
See application file for complete search history.

(56) References Cited

U.S. PATENT DOCUMENTS

| | | | | |
|---|---|---|---|---|
| 2008/0284433 A1* | 11/2008 | Kraus et al. | ................... | 324/309 |
| 2010/0127704 A1* | 5/2010 | Warntjes | ...................... | 324/309 |
| 2012/0262165 A1* | 10/2012 | Griswold et al. | ............. | 324/309 |

OTHER PUBLICATIONS

Doneva, Mariya et al., "Compressed Sensing Reconstruction for Magnetic Resonance Parameter Mapping," 2010, MRM 64, pp. 1114-1120.*
Schmitt, Peter et al., "Inversion Recovery TrueFISP: Quantification of T1, T2, and Spin Density," 2004, MRM 51, pp. 661-667.*

* cited by examiner

*Primary Examiner* — Melissa Koval
*Assistant Examiner* — Rishi Patel

(57) ABSTRACT

Apparatus, methods, and other embodiments associated with combined correlation parameter estimation are described. One example method includes accessing data associated with a magnetic resonance (MR) signal produced by relaxation of nuclei in an item that has experienced nuclear magnetic resonance (NMR) excitation. The MR signal is a function of two or more NMR parameters. The example method also includes accessing data associated with a set of comparative signal evolutions and computing a value for an NMR parameter based on a combined correlation of the data associated with the MR signal to the data associated with the set of comparative signal evolutions. The combined correlation will depend on at least two correlations between the data associated with the MR signal and two different members of the set of comparative signal evolutions.

23 Claims, 18 Drawing Sheets

COMBINED CORRELATION PARAMETER ANALYSIS

BACKGROUND

Magnetic resonance imaging relaxometry (MRIR) concerns the measurement of relaxation rates and/or relaxation times of spins that were excited by nuclear magnetic resonance (NMR). MRIR is based on the physical aspects of nuclei relaxing to the ground state after being excited by radio frequency (RF) energy associated with, for example, a spin inversion recovery sequence. To generate a "map" of a relaxation rate (e.g., R2=1/T2) or of relaxation times (e.g., T1 (spin-lattice relaxation), T2 (spin-spin relaxation), and spin density (M0) relaxation), at least two magnetic resonance (MR) images are acquired. Conventional relaxometry techniques have faced many challenges including accuracy and processing time.

Orthogonal matching pursuit (OMP) has been used to quantify MRI relaxation parameters including T1, T2, and M0. OMP involves finding a correlation between input signals and comparative signals stored, for example, in a dictionary. Items stored in the dictionary may be referred to as "atoms". Items in the dictionary may also be referred to as "dictionary entries".

For MRI relaxometry, the OMP dictionary may store simulated signal evolution curves that are a function of two or more relaxation parameters. For example, a dictionary of possible signal evolution curves may be generated for a specific range of possible T1 and T2 values. OMP has even been used to compare under-sampled images to comparative evolution curves to determine relaxation parameter maps. For OMP analysis of other (e.g., non relaxometry) NMR parameter analysis, the OMP dictionary may store simulated signal evolution curves that are a function of two or more NMR parameters.

However, using OMP for relaxometry and other analysis has faced challenges caused by the homogeneity and similarity of dictionary entries. The homogeneity and similarity is more pronounced when OMP is used for simultaneous relaxometry that is tasked with quantifying multiple relaxation parameters (e.g., T1, T2, M0) at the same time. Conventionally, to the extent that OMP dictionaries have been used in relaxometry, they have included very similar dictionary entries, which has lead to inaccurate relaxation parameter quantification. This problem is exacerbated in simultaneous multi-parameter OMP based relaxometry because dictionary entries become even more overly similar when the dictionary entries represent curves associated with variations in more than one relaxation parameter. These types of entries may prove problematic for distinguishing parameters when relaxation is fast and near the acquisition rate.

MRIR is the process of recovering the spin density spectrum from the time sample of the spin signal for pixels in an MR image. Conventionally, MRIR has involved substantial computation that may have lead to unacceptably long parameter determination times. The long computation times have been associated with conventional mathematical approaches to solving the spin relaxometry inverse problem. In addition to taking a long time, the conventional approaches may have yielded inaccurate results.

Conventional mathematical techniques used in MRIR may have initially considered that when an inversion recovery sequence is applied, the ideal value of a pixel's signal S at a time t is described by:

$$S(t) = \rho(1 - 2e^{-xt})$$

where
ρ=spin density,
x=spin relaxation rate in sec$^{-1}$, and
t=time in seconds.

Some OMP dictionaries may have included dictionary entries based on this initial idealized representation of a pixel's value.

However, since a pixel may represent several types of tissue, and since tissue types may have their own spin density (ρ) and their own spin relaxation rate (x), the ideal signal may be better described by:

$$S(t) = \sum_j \rho_j(1 - 2e^{-x_j t})$$

where j covers the different tissue types in the sample.
Alternatively, the ideal signal may be described using:

$$S(t) = Aj + Bj^{e^{(-t/Cj)}}$$

where A is a constant,
B is a constant,
t is time, and
C is a single relaxation parameter.

Some OMP dictionaries may have included entries based on this more sophisticated representation of a pixel's value.

Even this representation of the S(t) equation may be unsatisfactory because this representation unnaturally assumes that relaxation rates for spins in tissue are unique and distinct with sharp demarcations. It is more likely that spins exhibiting a range of relaxation rates clustered around a central value(s) will be encountered. Therefore, spin density (ρ) may be more of a continuous function and less of a discrete function. When the continuous function approach is observed, then S(t) may be even more realistically described by:

$$S(t) = \int \rho(x)(1 - 2e^{-xt}) dt$$

This representation would yield an idealized curve like curve 100 that is illustrated in FIG. 1. OMP dictionaries may have been built using this integral representation of S(t). However, due to measurement noise and other factors, an actual input curve may be more like curve 200 that is illustrated in FIG. 2. The idealized curve 100 and the actual curve 200 illustrate that MRIR will involve processing the noisy MRI signal (e.g., curve 200) and deriving the spin spectrum that generated the signal. This is known as an inverse problem because it involves working backwards from an observed S(t) to determine the actual input ρ(x). FIG. 3 illustrates the idealized curve 100 super-imposed on the noisy curve 200. OMP-based MRIR involves picking a curve 100 from an available set of idealized curves given noisy signal 200.

FIG. 4 illustrates one set of idealized curves 400, 410, 420, 430, 440, 450, and 460. These curves may all be a function of a single relaxation parameter or of a pair of relaxation parameters where one relaxation parameter is constant. Similar curves may be associated with other NMR parameters including, but not limited to, chemical shift, off-resonance, flow, perfusion, diffusion, motion, and uptake of biomarkers. FIG. 5 illustrates noisy signal 470 super-imposed on the set of curves 400-460. Conventionally, a best fit approach may have selected curve 420 or curve 430 as best matching noisy signal 470. However, a conventional best fit approach may have chosen curve 410 or 440 based on decisions made for an initial part of the input signal and due to sampling and/or under-sampling issues.

Attempts at solving the inverse problem for MRIR have been described as early as 1982. Recent attempts have produced relaxation parameter maps having pixel-wise parameter values for parameters including, but not limited to, T1, T2, and M0 relaxation. Unfortunately, these pixel-wise values may have been exploited in sub-optimal ways due, for example, to issues associated with performing conventional OMP. One issue with conventional OMP is that dictionary entries may be overly homogenous, particularly in the initial portion of a relaxation curve.

Recent advances in quantitative MRI data acquisition have facilitated simultaneously determining multiple relaxation parameters but have yet to provide satisfactory treatment of the inverse problem. For example, Schmitt, et al., *Inversion Recovery TrueFISP: Quantification of T1, T2, and Spin Density*, Magn Reson Med 2004, 51:661-667, describe extracting multiple relaxation parameters from a signal time course sampled with a series of TrueFISP images after spin inversion. TrueFISP imaging refers to true fast imaging with steady state precession. IR-TrueFISP refers to inversion recovery true fast imaging with steady state precession. TrueFISP is a coherent technique that uses a balanced gradient waveform. In TrueFISP, image contrast is determined by $T2^*$/T1 properties mostly depending on repetition time (TR). As gradient hardware has improved, minimum TRs have been reduced. Additionally, as field shimming has improved, signal to noise ratio has improved making TrueFISP suitable for whole-body applications, for cardiac imaging, for brain tumor imaging, and for other applications. While this represents a significant advance in simultaneously acquiring pixel-wise values, the inverse problem remains an issue.

Doneva, et al., *Compressed sensing reconstruction for magnetic resonance parameter mapping*, Magn Reson Med 2010, Volume 64, Issue 4, pages 1114-1120 take one approach to the inverse problem. Doneva describes a dictionary based approach for parameter estimating. Doneva applies a learned dictionary to sparsify data and then uses a model based reconstruction for MR parameter mapping. Doneva identifies that "multiple relaxation components in a heterogeneous voxel can be assessed." The success of this approach depends heavily on the learned dictionary. However, the Doneva library is limited to the idealized, single relaxation parameter curves because the preparation is specific and constrained by the fact that Doneva ultimately reconstructs an image from the acquired data. This constraint may yield a dictionary with overly homogenous relaxation curves against which input curves are to be fit or matched. Also, this approach may be unsuitable for simultaneous multi-parameter relaxometry where multiple relaxation parameters are determined at the same time.

Thus, even though more and more pixel-wise relaxation parameter data is becoming available, and even though that data is becoming available in ever shorter, more clinically relevant time frames, the data may still not lead to acceptably accurate relaxation parameter maps due to issues with solving the inverse problem. Similar issues may remain with other non-relaxation parameters.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
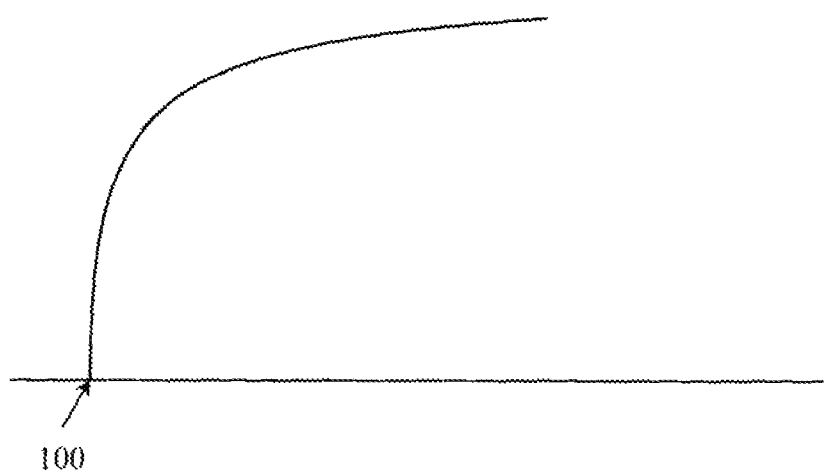
FIG. 1 illustrates an idealized relaxation curve.
Figure 2:
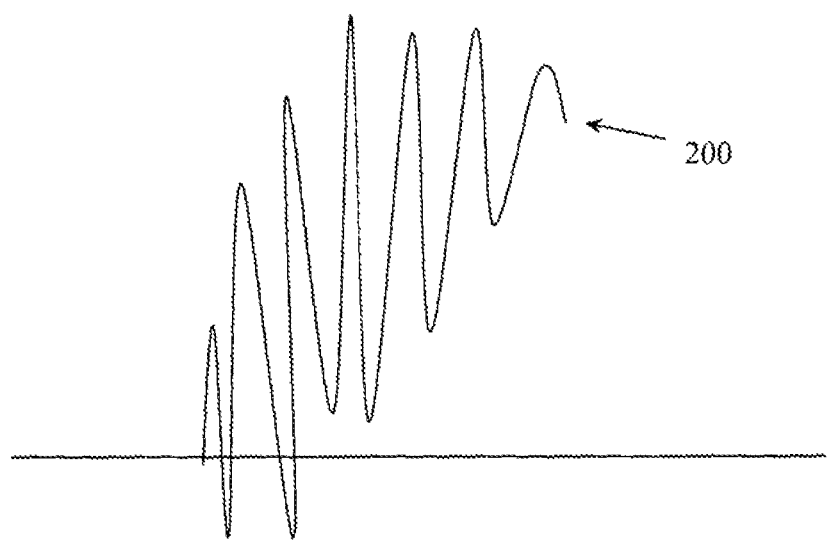
FIG. 2 illustrates a noisy signal.
Figure 3:
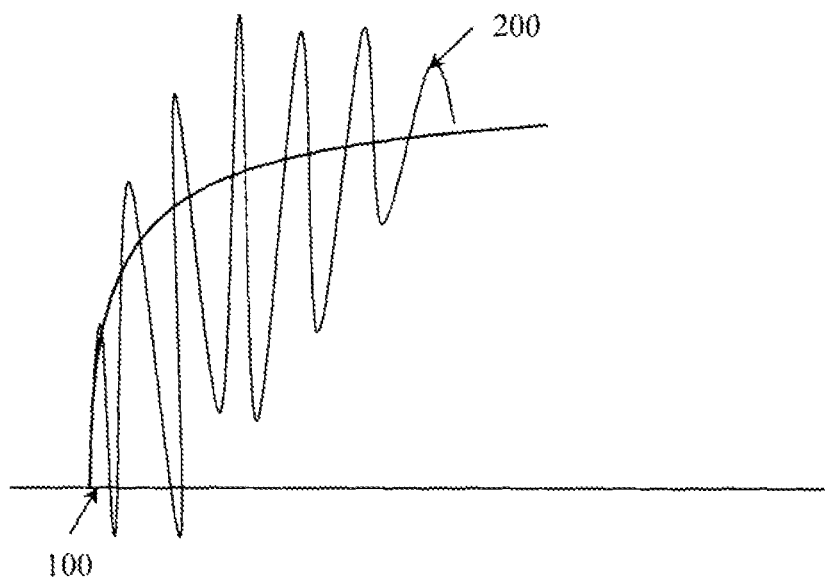
FIG. 3 illustrates a noisy signal super-imposed on an idealized curve.

In one type of OMP based relaxometry, the time course of pixels in a set of time-resolved aliased images is compared to entries in a dictionary. In conventional single parameter OMP, the entry that most closely matches the input time course is selected. This entry can then be used to construct a single parameter map. The most closely matching dictionary entry is selected from the dictionary based on the highest correlation between the input time course and the entries. While this approach sometimes yields acceptable results for single parameter OMP, this approach may yield less acceptable results for multi-parameter OMP due, at least in part, to the entry homogeneity and similarity issue.

Example apparatus and methods take a different approach, where the single highest correlation for a single parameter is not automatically selected. The single highest parameter is not selected because simultaneous multi-parameter OMP may be trying to quantify multiple parameters (e.g., T1, T2, diffusion) and a more comprehensive collaborative selection may be appropriate. An example OMP dictionary may include many T1 values. The T1 values may be paired with different T2 values. An unwise choice with respect to T1 may negatively affect not just T1 but also T2. Similarly, an unwise choice with respect to T2 may negatively affect not just T2, but also T1 because the example OMP dictionary may also include many T2 values that are paired with different T1 values.

Therefore, example apparatus and methods have multiple dictionary entries "vote" or contribute to a combined correlation. When multiple entries vote, there may be similarities and differences between the potential results. However, by combining the votes, a most suitable result can be selected. In one example, the voting takes the form of contributing a correlation value to an average correlation value. The most suitable result may then be defined as the resulting average. While an average is described, one skilled in the art will appreciate that other combinations of votes may be employed.

In one embodiment, example apparatus and methods examine a combined (e.g., average) correlation for multiple dictionary entries at a first (e.g., T1) parameter value over multiple values for a second parameter (e.g., T2) to provide an estimate for how similar a particular entry is to the input data to be fit with respect to the first parameter. Instead of picking the entry with a highest individual correlation, an entry (or entries) with a highest combined (e.g., average) correlation is selected. While T1 and T2 are described as being estimated simultaneously, one skilled in the art will appreciate that other combinations of parameters, both relaxation and non-relaxation parameters, may be simultaneously examined. Additionally, while two relaxation parameters are described being simultaneously examined, in some embodiments, two or more parameters may be simultaneously examined.

The combined (e.g., average) correlation approach is then repeated for the second parameter value (e.g., T2) where multiple dictionary entries at a second (e.g., T2) parameter value over multiple values for the first parameter (e.g., T1) are examined to provide an estimate for how similar a particular entry is to the input data to be fit with respect to the second parameter.

In one embodiment, where T1 and T2 are simultaneously estimated, the average correlation for all dictionary entries at a particular T1 value over all T2 values yields an estimate for how similar that particular T1 signal evolution is to the under-sampled curve to be fit. In this embodiment, the T1 value with the highest average correlation is selected. The same procedure is followed to estimate the T2 value. In this embodiment, multiple curves (dictionary entries) vote for the best value for each parameter. This average correlation facilitates resolving ambiguities between similar dictionary entries and facilitates selecting appropriate dictionary entries. While T1 and T2 are described as being estimated simultaneously, one skilled in the art will appreciate that other combinations of parameters may be simultaneously examined. Additionally, while two parameters are described being simultaneously examined, in some embodiments, two or more parameters may be simultaneously examined.

In another embodiment, the combined correlation for dictionary entries at a particular value for a first parameter are examined over dictionary entries for a second parameter to determine an estimate for how similar that particular first parameter based signal evolution is to the under-sampled curve to be fit. In this embodiment, the first parameter value with the highest combined correlation is selected. The same procedure is followed to estimate the value for the second parameter. In this embodiment, multiple dictionary entries vote for the winning value for the parameters. This combined correlation facilitates resolving ambiguities between similar dictionary entries and facilitates selecting appropriate dictionary entries.

Figure 4:
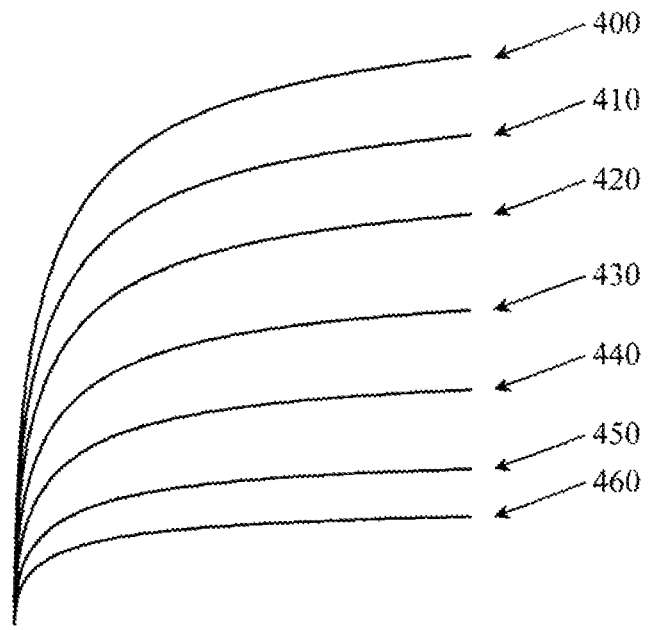
FIG. 4 illustrates a set of idealized relaxation curves.
Figure 5:
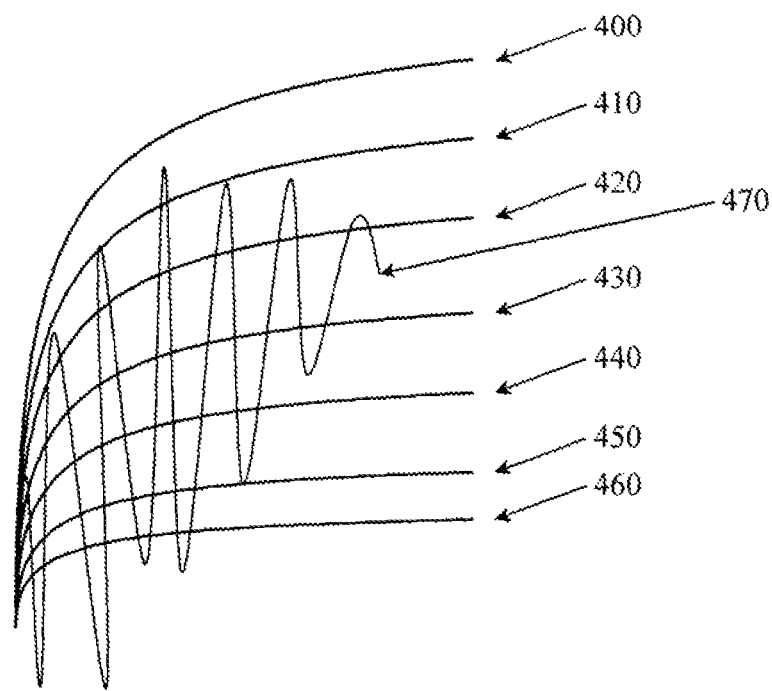
FIG. 5 illustrates a noisy signal super-imposed on a set of idealized relaxation curves.
Figure 6:
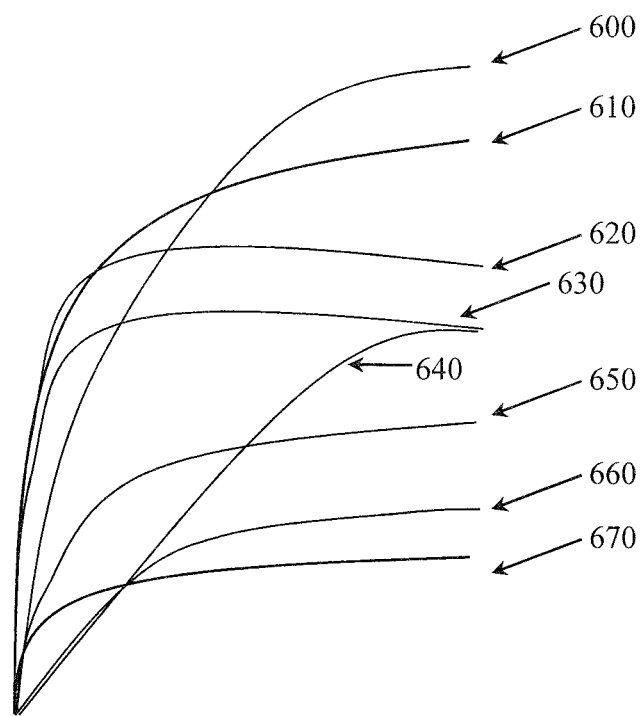
FIG. 6 illustrates a set of dictionary entries associated with a multi-parameter OMP dictionary.

Relaxation equations are known for different tissues and excitation schemes. For example, model IR-TrueFISP T1 relaxation equations and model IR-TrueFISP T2 relaxation equations are known. Thus, simulated signal evolutions can be computed using the known relaxation equations. The simulated signal evolutions can become entries in an OMP dictionary. Once again, while relaxation equations and relaxation parameters are described, one skilled in the art will appreciate that other NMR parameters may be similarly analyzed. In one embodiment, dictionary entries may be added until a desired level of heterogeneity is achieved. In another embodiment, dictionary entries may be added until a desired coverage range of possible signal evolution curves is achieved. While FIG. 4 illustrated one set of initially homogenous dictionary entries, FIG. 6 illustrates less homogenous dictionary entries computed from relaxation equations. Note how some entries (e.g., 600/620, 640/660) are initially similar but then diverge. Note also how some dictionary entries (e.g., 630/640) are initially dissimilar but then converge. These convergences and divergences may be explained by the entries being a function of two or more parameters rather than a single parameter.

Figure 7:
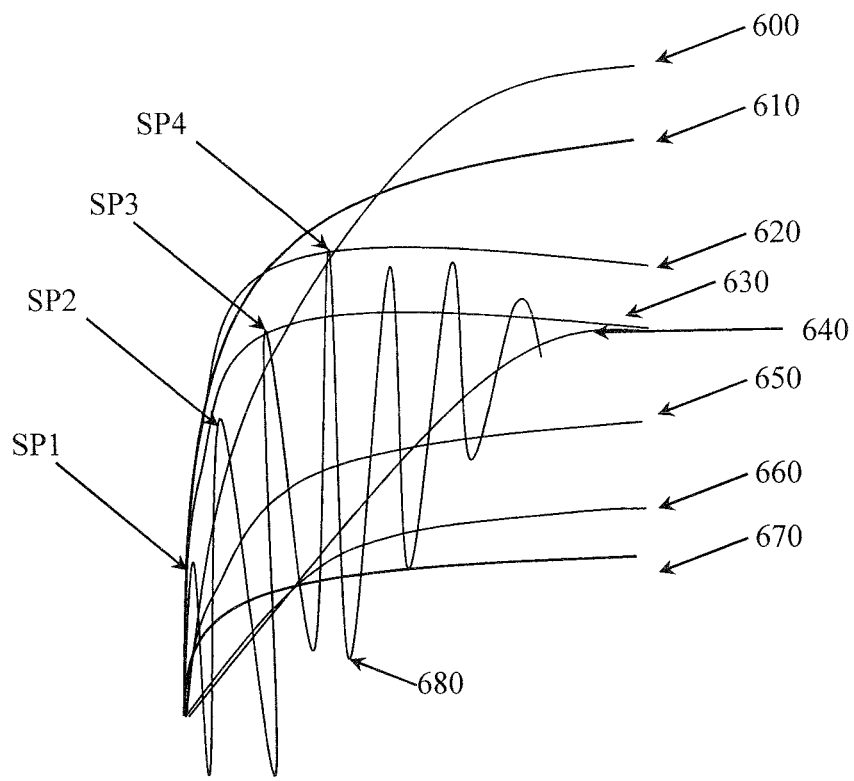
FIG. 7 illustrates a noisy signal super-imposed on a set of dictionary entries associated with a multi-parameter OMP dictionary.

FIG. 7 illustrates a noisy signal 680 super-imposed on the set of curves 600-670. One skilled in the art may recognize that a pure best fit approach for an initial portion of noisy signal 680 may lead to an inaccurate result for a later portion. Similarly, a pure best fit approach for a later portion of a noisy signal 680 may lead to an inaccurate result for an initial portion. Additionally, if an unfortunate set of sample points SP1, SP2, SP3, and SP4 are chosen to under-sample 680, then the single best fit might be 610!

One skilled in the art will recognize that dictionary entries 600 through 670 have different shapes because they are functions of two parameters. Some entries (e.g., 600, 610, 620, 630) have a very steep initial portion that indicates a very fast initial relaxation. After similar initial fast relaxation, these entries then diverge widely but diverge into an "upper range" where all of 600 through 630 finish higher than 640 through 670. Some entries (e.g., 640, 650, 660, 670) have a less steep initial relaxation. After dissimilar initial slow relaxation, these entries then are similarly flat and all end up in a "lower range" where all of 640 through 670 finish lower than 600 through 630. Therefore, an average finishing value for 600-630 would be higher than an average finishing value for 640-670. One skilled in the art will recognize that initial relaxation and subsequent relaxation may be determined by combinations of T1 and T2. For example, rather than performing a best fit that selects curve 630 and takes both T1 and T2 estimates from 630, a combined correlation fit may select an average value for dictionary entries that are relevant to 680.

Noisy signal 680 may be better fit to entries 600-670 using a combined correlation relaxometry approach that considers, for example, an average T1 correlation and an average T2 correlation, rather than an instantaneous single best fit correlation. To understand the basics of a combined correlation OMP-based relaxometry approach, consider FIGS. 8 through 11.

Figure 8:
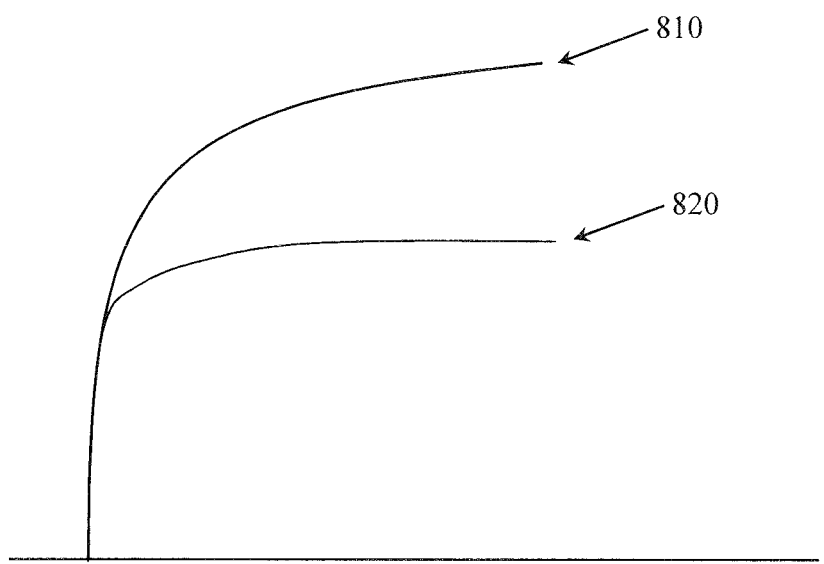
FIG. 8 illustrates two relaxation curves that are similar through an initial portion and dissimilar through a subsequent portion.
Figure 9:
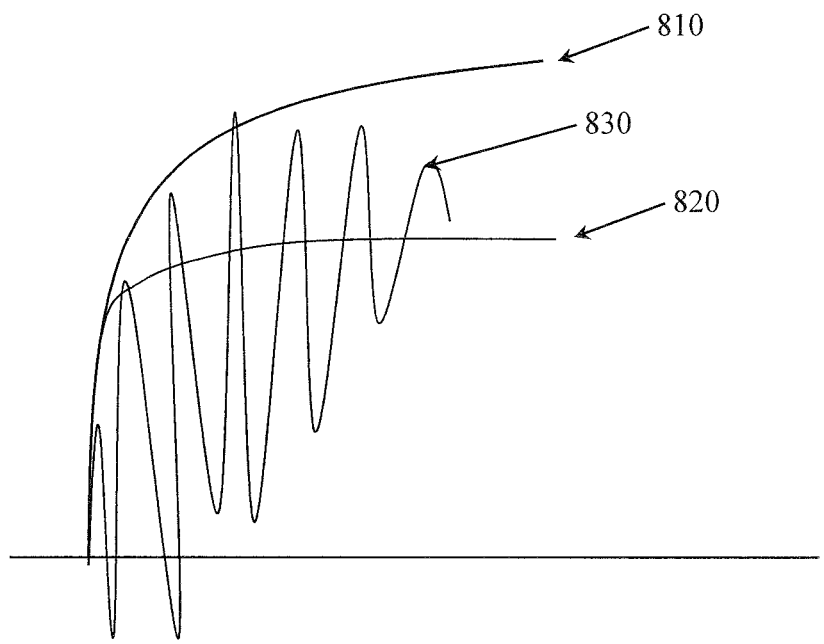
FIG. 9 illustrates a noisy signal super-imposed on two relaxation curves that are similar through an initial portion and dissimilar through a subsequent portion.

FIG. 8 illustrates a dictionary entry 810 and a dictionary entry 820 that both exhibit a very steep initial relaxation followed by a divergence. If the curves are a function of T1 and T2, both entries 810 and 820 may have similar T1 values but have dissimilar T2 values. FIG. 9 illustrates noisy signal 830 super-imposed on entries 810 and 820. If the initial portions of 810 and 820 are due to similar T1 relaxation, either 810 or 820 could provide a good fit for T1 for noisy signal 830. However, an unwise T1-centric choice could lead to an inaccurate result for T2. For example, 820 may be a better choice with respect to T2, even though 810 is a satisfactory choice for T1. A combined correlation approach may facilitate still estimating an acceptably accurate value for T1 while also facilitating estimating an improved accuracy value for T2. Similar results may be obtained for other NMR parameters using a similar combined correlation approach.

Figure 10:
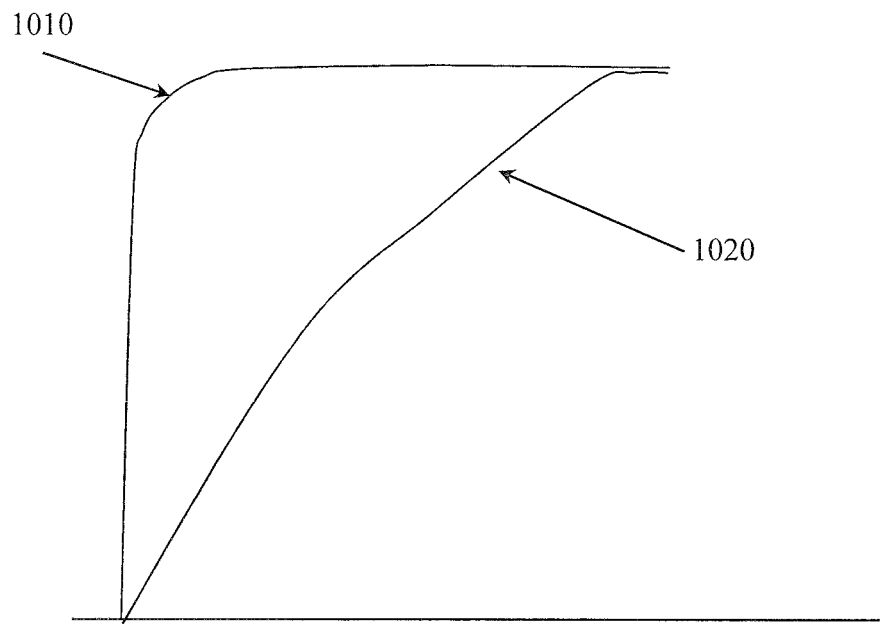
FIG. 10 illustrates two relaxation curves that are dissimilar through an initial portion and similar through a subsequent portion.
Figure 11:
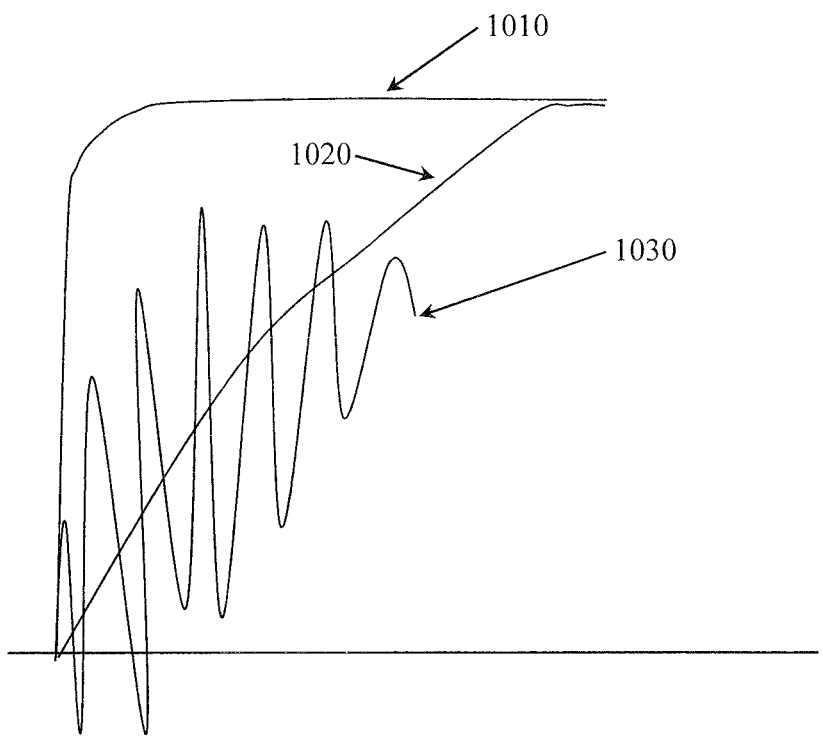
FIG. 11 illustrates a noisy signal super-imposed on two relaxation curves that are dissimilar through an initial portion and similar through a subsequent portion.

FIG. 10 illustrates an entry 1010 and an entry 1020 that exhibit different initial relaxation followed by a later convergence. If the curves are a function of T1 and T2, both entries 1010 and 1020 may have similar T2 values but be associated with different T1 values. FIG. 11 illustrates noisy signal 1030 super-imposed on dictionary entries 1010 and 1020. The initial portions of 1010 and 1020 may be primarily a function of T1 relaxation. The later portions of 1010 and 1020 may be primarily a function of T2 relaxation. In this case, then neither entry provides a good fit for 1030 in either T1 or T2. However, one or the other would be chosen in a conventional approach. Now consider if dictionary entries 1010, 1020, 810, and 820 were all in an OMP dictionary to which noisy signal 830/1130 was to be fit. Some of the entries provide useful information about T1 and other entries provide useful information about T2. By accepting contributions to T1 estimates from multiple entries, instead of from one best-fit entry, and by accepting contributions to T2 estimates from multiple entries, instead of from one best-fit entry, a better estimate may be provided for both T1 and T2. In one embodiment, the contributions may be combined through arithmetic averaging. In one embodiment, entries that satisfy an initial threshold may be retained and then contributions accepted from those entries while contributions are not accepted from the rejected entries. The acceptance/rejection may be based on a fit that satisfies a threshold correlation. In this way, a best fit on a single parameter that yields a bad fit on a second parameter may be replaced by a good fit on both parameters.

Generally, one solution to the inverse problem can be described like this. Given the relaxation equations, the theoretically possible curves (dictionary entries) can be computed. So, a dictionary with good coverage of the simulated and/or estimated entries is generated. Then a noisy signal is received. The noisy signal may be under-sampled. The solution involves picking the entry that fits the under-sampled noisy sample the "best". However, we get to define what "best" means. Rather than use a single parameter OMP best fit entry, a combined (e.g., average) correlation approach may be employed. The approach asks "what is the average T1 value for entries that are relevant to the signal"? The approach also asks "what is the average T2 for entries that are relevant to the signal"? We can define what is relevant as meaning, for example, all entries, all entries that correlate to within a correlation threshold, and so on.

Example apparatus and methods may access an input signal isig(t). The input signal isig(t) may be a function of a combination of parameters (e.g., T1 and T2). Example apparatus and methods may also access a dictionary of OMP entries that are a function of the same combination of parameters. In one embodiment, example apparatus and methods may contribute entries to the dictionary until, for example, a heterogeneity and/or coverage threshold is met. This may increase the odds that good fits on multiple parameters may be achieved. In one example, the OMP entries may be idealized signal evolutions and isg(t) is a noisy input signal.

Example apparatus and methods may fit the noisy signal to the entries to find the "best" match. The fit may be based on a combined correlation to yield combined correlation relaxometry instead of single parameter best fit relaxometry. The fit may be an OMP based fit. One way to perform a combined correlation is to determine an average correlation.

By way of illustration, assume that entries are a function of two parameters, T1 and T2. The following pseudo-code describes one example for estimating T1 and T2 using OMP based combined correlation relaxometry.

```
// Determine "best" T1 value
For I = each T1 value in an OMP dictionary
    Set Total_T1_correlation[I] to zero
        For J = each T2 value available for T1_I
            Total_T1_correlation[I] += correlation (isig(t), T1_I, T2_J)
        End for J
    Set K = number of T2 values available for T1_I
    Combined_T1_correlation[I] = f(Total_T1_correlation[I], K)
End for I
Select T1 from the set of Combined_T1_correlations.
// The selection may be, for example, selecting the highest score.
// the value of f(Total_T1_correlation[I], K) may be, for example...
// Total_T1_correlation[I] / K
// Determine "best" T2 value
For J = each T2 value in the OMP dictionary
    Set Total_T2_correlation[J] to zero
        For I = each T1 value available for T2_J
            Total_T2_correlation[J] += correlation (isig(t), T2_J, T1_I)
        End for I
    Set K = number of T1 values available for T2_J
    Combined_T2_correlation[J] = f(Total_T2_correlation[J], K)
End for J
Select T2 selected from the set of Combined_T2_correlations.
// The selection may be, for example, selecting the highest score.
// the value of f(Total_T2_correlation[J], K) may be, for example...
// Total_T2_correlation[J] / K
```

In one example, the contribution of correlation (isig(t), $T1_I$, $T2_J$) or correlation (isig(t), $T2_J$, $T1_I$) could be weighted based, for example, on the closeness of a fit. In this way, the best fits may contribute more to total correlation while the worst fits are discounted.

Figure 12:
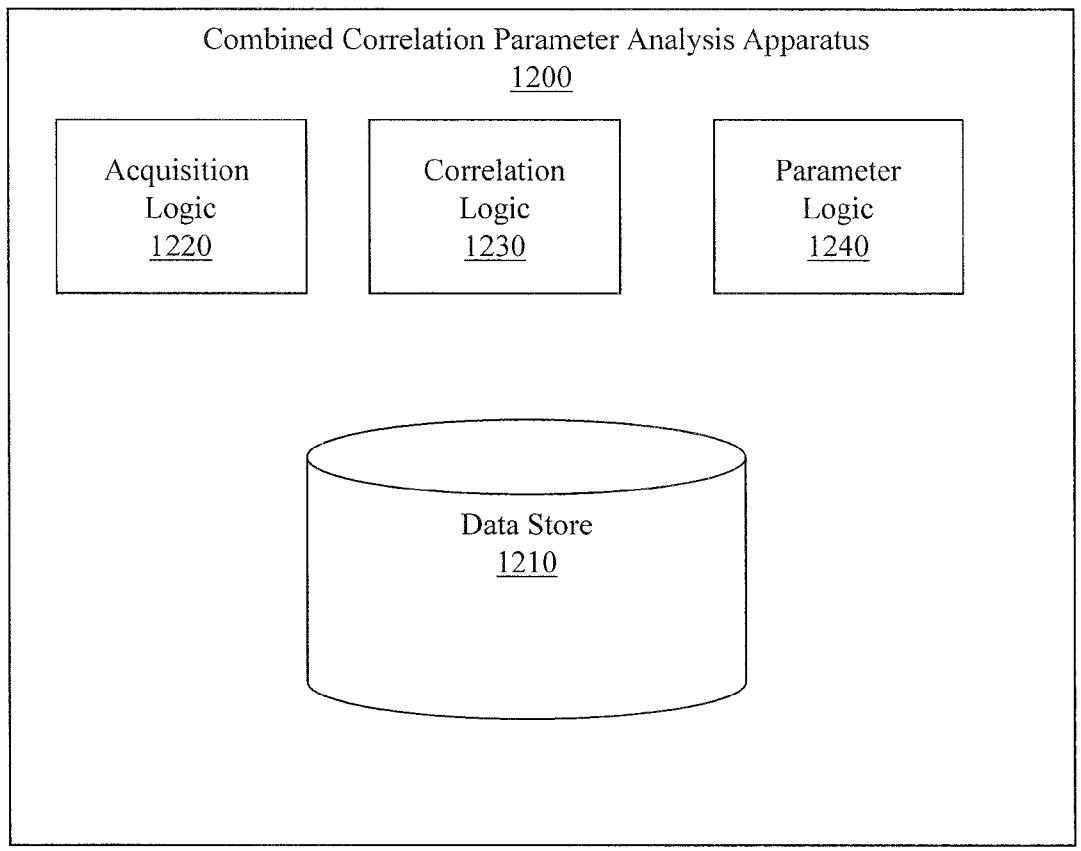
FIG. 12 illustrates a combined correlation parameter analysis apparatus.

FIG. 12 illustrates a combined correlation parameter analysis apparatus 1200 that includes a data store 1210, an acquisition logic 1220, a correlation logic 1230, and a parameter logic 1240.

In one embodiment, the data store 1210 is configured to store a set of dictionary entries. The dictionary entries may be, for example, relaxometry entries. Individual relaxometry dictionary entries are a function of NMR parameters and an NMR excitation scheme. The NMR relaxation parameters can include, but are not limited to, T1, T2, and M0. The excitation schemes include, but are not limited to, an IR TrueFisp excitation scheme. In different examples the dictionary entries may also include other NMR parameters including, but not limited to, chemical shift, off-resonance, flow, perfusion, diffusion, motion, and uptake of biomarkers.

In one embodiment, the acquisition logic 1220 is configured to acquire a noisy MR signal from an item that was subjected to NMR excitation and that is experiencing NMR relaxation. The noisy MR signal is produced by the NMR relaxation and NMR relaxation is a function of two or more NMR parameters and therefore the MR signal is also a function of two or more NMR parameters.

In one embodiment, the correlation logic 1230 is configured to determine a correlation between the noisy MR signal and a member of the set of dictionary entries. In one example, the correlation is determined using an OMP correlation between the noisy MR signal and members of the set of dictionary entries.

In one embodiment, the parameter logic 1240 is configured to compute a relaxation value for an NMR relaxation parameter based on at least two correlations determined by the correlation logic 1230. In one example, the parameter logic 1240 will compute values for all possible correlations and take an average of the parameter values resulting from the complete correlation space. In another example, the parameter logic 1240 will compute values for less than all possible correlations and will make some combination of the parameter values resulting from the incomplete correlation space. In one embodiment, the parameter logic 1240 is configured to compute relaxation values for at least two of the two or more NMR relaxation parameters based on at least two correlations determined by the correlation logic 1230. In one example, the parameter logic 1240 may compute the relaxation values in parallel. In different examples, the parameter logic 1240 may compute values for other NMR parameters.

Figure 13:
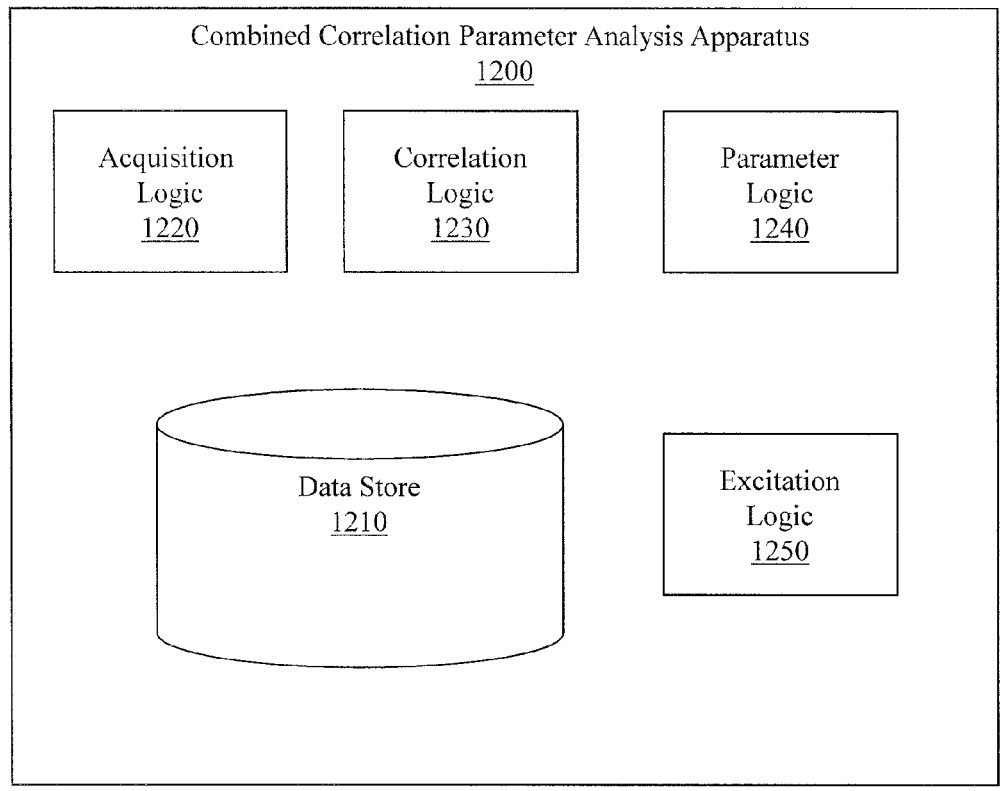
FIG. 13 illustrates a combined correlation parameter apparatus.

FIG. 13 illustrates another embodiment of apparatus 1200. This embodiment includes an excitation logic 1250 that is configured to produce the NMR excitation of the item. The excitation may be produced in response to schemes including, but are not limited to, an IR TrueFisp excitation scheme.

Figure 14:
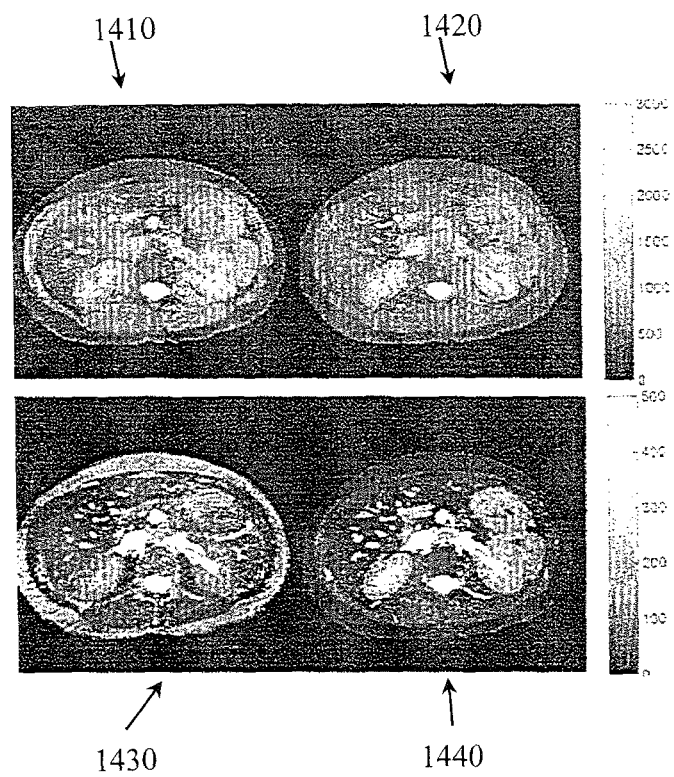
FIG. 14 illustrates T1 and T2 maps.

FIG. 14 illustrates T1 and T2 maps. Map 1410 is a T1 map generated using standard OMP. Map 1420 is a T1 map generated using combined correlation OMP. Map 1430 is a T2 map generated using standard OMP. Map 1440 is a T2 map generated using combined correlation OMP. Maps 1410 and 1430, which were created using standard OMP, exhibit residual streaking. Maps 1410 and 1430 also appear to inaccurately estimate relaxation values. This inaccuracy is pronounced in map 1430, especially in the T2 values for fat, which were estimated as being in the range of 200-300 ms. This is significantly longer than generally accepted estimates for T2 for fat. Maps 1420 and 1440 exhibit less residual streaking and provide more accurate relaxation parameter estimates. Maps 1410 and 1430 were derived by determining which curve in an OMP dictionary was closest to the relaxation curve for each pixel using a highest correlation value. Maps 1420 and 1440 were derived using example apparatus and methods described herein that selected T1 and T2 values having the highest average correlation over the OMP dictionary.

Figure 15:
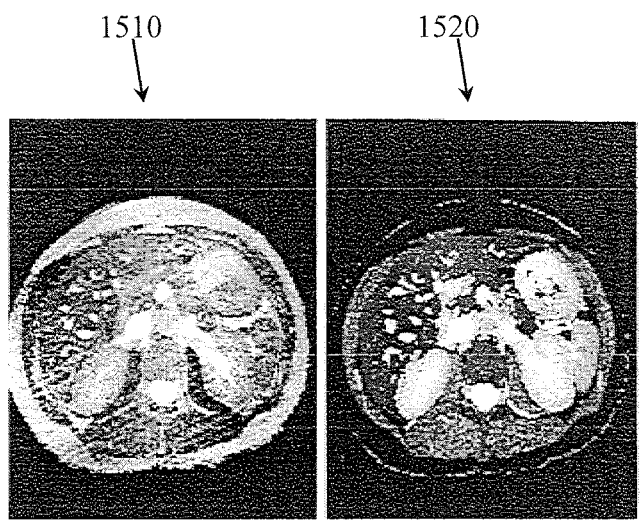
FIG. 15 illustrates T2 weighted images.

FIG. 15 illustrates T2 weighted images corresponding to the maps in FIG. 14. Image 1510 was produced from maps computed using standard OMP. Image 1520 was produced from maps computed using combined correlation OMP. Note the bright fat resulting from the inaccurately estimated T2 value in image 1510. Bright fat is not expected in a T2-weighted image. This bright fat is not present in image 1520.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 16:
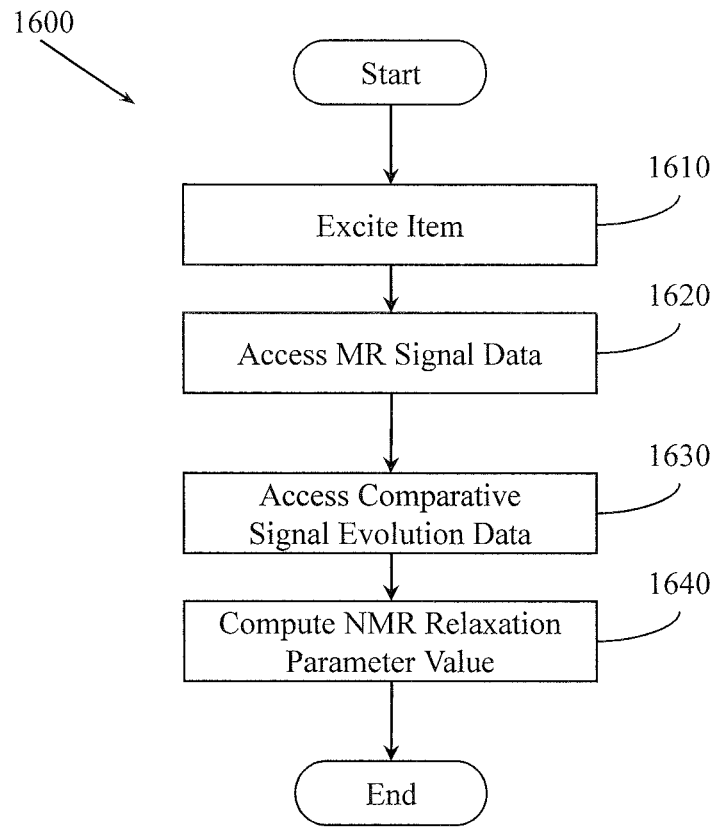
FIG. 16 illustrates a method associated with combined correlation parameter analysis.

FIG. 16 illustrates a method 1600 for performing combined correlation parameter analysis. Method 1600 includes, at 1610, exciting an item. The exciting is NMR excitation and may be achieved in response to, for example, an IR-TrueFISP scheme.

Method 1600 may also include, at 1620, accessing data associated with a magnetic resonance (MR) signal produced during relaxation of nuclei in an item that experienced the NMR excitation. Since the nuclei will relax according to two or more NMR parameters, the resulting MR signal is a function of two or more NMR parameters. The NMR parameters can include, but are not limited to, T1, T2, and M0. Accessing the data may include, for example, generating the data by sampling the potentially noisy MR signal. Accessing the data may also include, for example, accessing a data structure stored in a computer.

Method 1600 may also include, at 1630, accessing data associated with a set of comparative signal evolutions. The set of comparative signal evolutions may be stored as entries in an OMP dictionary. Since the entries are used to fit the signal data, a member of the set of comparative signal evolutions will also be designed as functions of N NMR parameters, N being an integer greater than one. Accessing data associated with the set of comparative signals may include, for example, accessing a data structure in a computer, receiving a set of records across a computer network, and so on. In one example, accessing the set of comparative signal evolutions may even include generating the entries and storing the entries in an OMP dictionary.

With the data associated with the MR signal and with the data associated with the set of comparative signal evolutions available, method 1600 proceeds, at 1640, to compute a value for at least one of the two or more NMR parameters. In one example, method 1600 is configured to compute the value for at least one of the two or more NMR parameters in less than 5 seconds per slice of the item.

Rather than estimating a value based on a single best fit correlation, the value is computed based on values from two or more correlations of the data associated with the MR signal to the data associated with the set of comparative signal evolutions. The combined correlation therefore depends on at least two correlations between the data associated with the MR signal and two different members of the set of comparative signal evolutions. The correlations may be made using, for example, OMP.

While at least two correlations are described, one skilled in the art will appreciate that a greater number of correlations and different subsets and combinations of correlations may be considered. By way of illustration, in one example, the set of values from which the first NMR relaxation parameter will be estimated will include an entry for a correlation between every member of the set of comparative signal evolutions and the MR signal. But, in another example, the set of values from which the first NMR relaxation parameter will be estimated only includes entries for members of the set of comparative signal evolutions that correlate to the MR signal to within a correlation threshold. Similarly, in different examples, the set of values from which the second NMR relaxation parameter will be estimated may include an entry for a correlation between every member of the set of comparative signal evolutions and the MR signal or may only include entries for members of the set of comparative signal evolutions that correlate to the MR signal to within a correlation threshold.

In one example, method 1600 may also include producing the set of comparative signal evolutions. The set of comparative signal evolutions may be computed from, for example, previously acquired signal evolutions, simulated signal evolutions, signal evolutions computed from relaxation equations, and so on. The accuracy of an estimation may depend, at least in part, on the dictionary of entries to which an input signal can be compared. Therefore, in one example, method 1600 can include configuring the dictionary of entries to have a desired coverage threshold. Coverage refers to the range of parameter values (e.g., 0 ms to 2000 ms for T1) and to the combination of ranges of parameter values (e.g., T1 from 0 ms to 2000 ms with T2 intervals of 20 ms).

Figure 17:
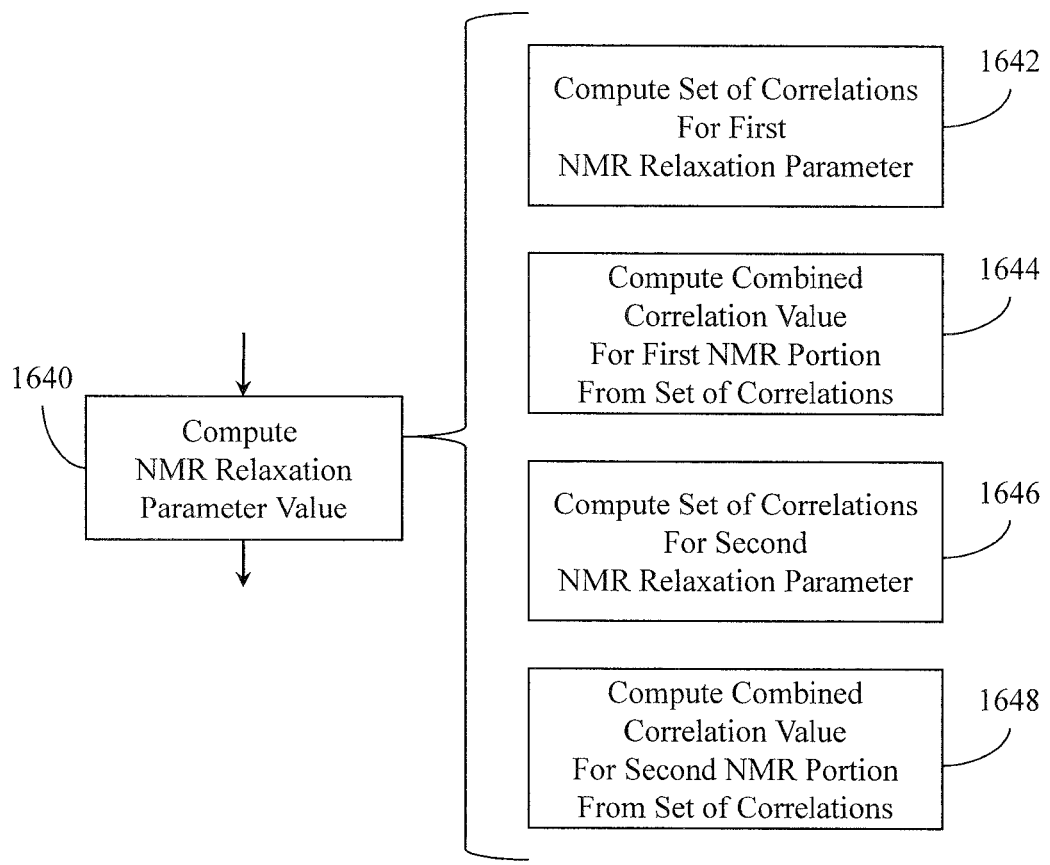
FIG. 17 illustrates in greater detail a portion of a method associated with combined correlation parameter analysis.

FIG. 17 illustrates in greater detail a portion of method 1600. The greater detail concerns computing the NMR parameter value at 1640. In one example, action 1640 may include, at 1642, computing a set of values for a first NMR parameter from the two or more NMR parameters. The set of values will be based on a first set of correlations between the MR signal and a subset of members of the set of comparative signal evolutions. As described above, the first set of correlations may be a complete set of correlations or a smaller, constrained set of correlations. With the correlations determined, action 1640 may also include, at 1644, computing a combined correlation value for the first NMR parameter from the set of values for the first NMR parameter. In different examples the combined correlation value can be computed using, for example, an average, a weighted average, a mean value, and other approaches.

Action 1640 can also include, at 1646, computing a set of values for a second NMR parameter. The set of values may be based on a second set of correlations between the MR signal and a subset of members of the set of comparative signal evolutions. Once again, in different examples the second set of correlations may be a complete set, an incomplete set, a constrained set, and so on. With the correlations available, action 1640 may proceed, at 1648, to compute a combined correlation value for the second NMR parameter from the set of values for the second NMR parameter. Computing the combined correlation value for the second NMR parameter may include, for example, taking the average of the set of values for the second NMR parameter, taking a weighted average, or performing some other combinatorial method. In one embodiment, either the first NMR parameter and/or the second NMR parameter may be relaxation parameters (e.g., T1, T2, M0).

In one embodiment, computer-executable instructions are stored on a non-transitory computer-readable medium. The instructions, when executed by the computer, control the computer to perform a method. The method may be, for example, methods described above. In one embodiment, the method includes controlling a computer to step through all T1 values in an OMP dictionary, and, for each T1 value, determining an average correlation for all dictionary entries over all T2 values. After examining all T1 values, the T1 value with highest average correlation is selected. The method then includes controlling the computer to step through all T2 values in dictionary, and, for each T2 value, determining an average correlation for all entries over all T1 values. After examining all T2 values, the T2 value with highest average correlation is selected.

Figure 18:
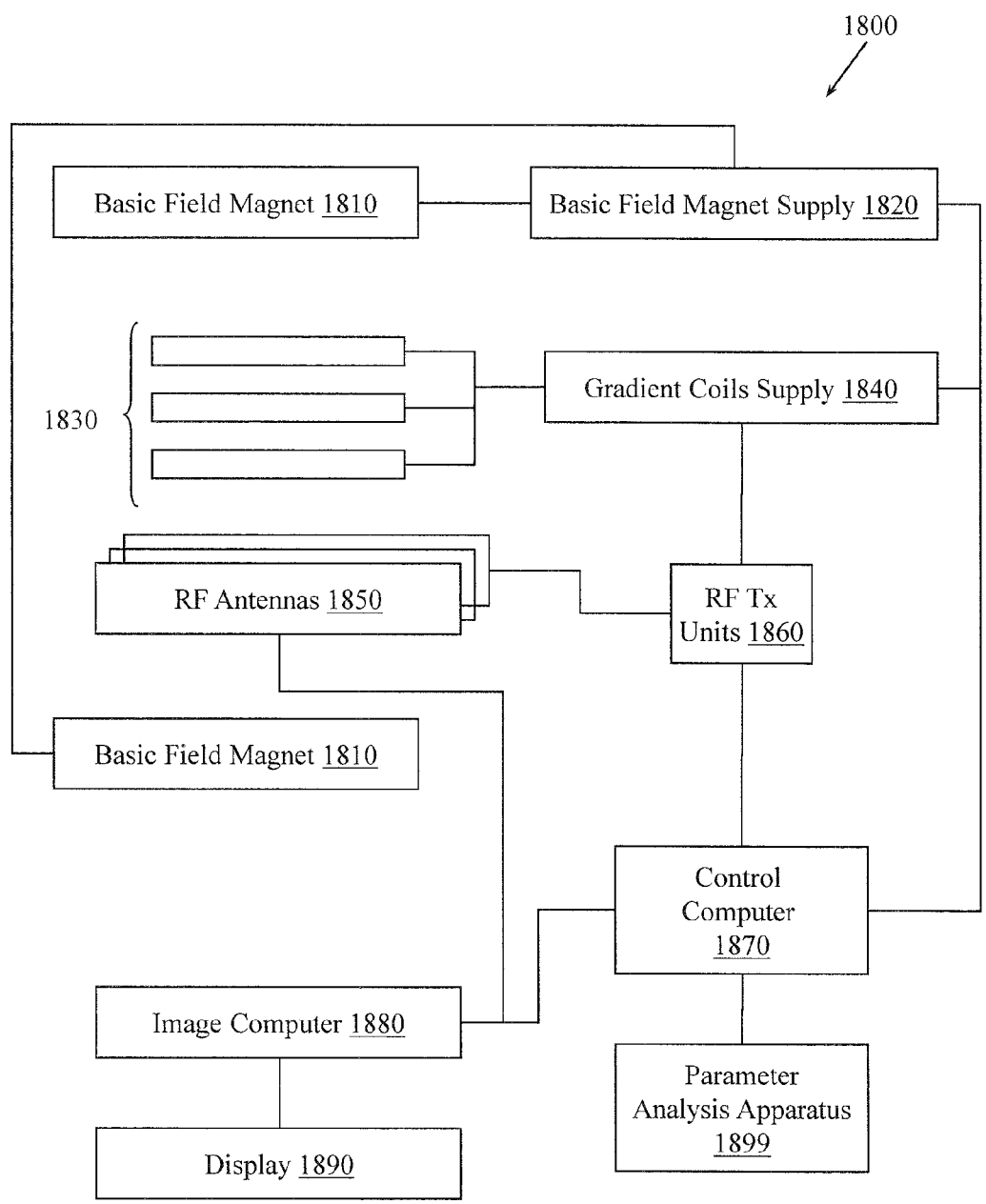
FIG. 18 illustrates an NMR apparatus.

FIG. 18 illustrates an example MRI apparatus 1800 configured with a combined correlation parameter analysis apparatus 1899. The combined correlation parameter analysis apparatus 1899 may be configured with elements of example apparatus described herein and/or may perform example methods described herein.

The apparatus 1800 includes a basic field magnet(s) 1810 and a basic field magnet supply 1820. Ideally, the basic field magnets 1810 would produce a uniform $B_0$ field. However, in practice, the $B_0$ field may not be uniform, and may vary over an object being imaged by the MRI apparatus 1800. MRI apparatus 1800 may include gradient coils 1830 configured to emit gradient magnetic fields like $G_S$, $G_P$ and $G_R$. The gradient coils 1830 may be controlled, at least in part, by a gradient coils supply 1840. In some examples, the timing, strength, and orientation of the gradient magnetic fields may be controlled, and thus selectively adapted, during an MRI procedure.

MRI apparatus 1800 may include a set of RF antennas 1850 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 1850 may be controlled, at least in part, by a set of RF transmission units 1860. An RF transmission unit 1860 may provide a signal to an RF antenna 1850.

The gradient coils supply 1840 and the RF transmission units 1860 may be controlled, at least in part, by a control computer 1870. In one example, the control computer 1870 may be programmed to control an NMR device as described herein. Conventionally, the magnetic resonance signals received from the RF antennas 1850 can be employed to generate an image and thus may be subject to a transformation process like a two dimensional FFT that generates pixilated image data. The transformation can be performed by an image computer 1880 or other similar processing device. The image data may then be shown on a display 1890.

While FIG. 18 illustrates an example MRI apparatus 1800 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
    accessing data associated with a magnetic resonance (MR) signal produced during relaxation of nuclei in an item that experienced nuclear magnetic resonance (NMR) excitation, where the MR signal is a function of two or more NMR parameters;
    accessing data associated with a set of comparative signal evolutions, where a member of the set of comparative signal evolutions is determined by a function of N NMR parameters, N being an integer greater than one; and
    computing a value for at least one of the two or more NMR parameters based on a combined correlation of the data associated with the MR signal to the data associated with the set of comparative signal evolutions,
    where the combined correlation depends on at least two correlations between the data associated with the MR signal and two different members of the set of comparative signal evolutions,
    the combined correlation comprising:
        determining a plurality of values for a first NMR parameter from the two or more NMR parameters based on a first plurality of correlations between the MR signal and a subset of members of the set of comparative signal evolutions; and
        computing a combined correlation value for the first NMR parameter from the plurality of values for the first NMR parameter by taking the average of the plurality of values for the first NMR parameter.

2. The method of claim 1, comprising producing the at least two correlations using an orthogonal matching pursuit (OMP).

3. The method of claim 1, where the two or more NMR parameters comprise, spin-lattice relaxation (T1), spin-spin relaxation (T2), and spin density relaxation (M0).

4. The method of claim 1, the combined correlation comprising:
    determining a plurality of values for a second NMR parameter based on a second plurality of correlations between the MR signal and a subset of members of the set of comparative signal evolutions; and
    computing a combined correlation value for the second NMR parameter from the plurality of values for the second NMR parameter.

5. The method of claim 4, where computing the combined correlation value for the second NMR parameter comprises taking the average of the plurality of values for the second NMR parameter.

6. The method of claim 1, where the plurality of values for the first NMR parameter includes an entry for a correlation between every member of the set of comparative signal evolutions and the MR signal.

7. The method of claim 1, where the plurality of values for the first NMR parameter only includes entries for members of the set of comparative signal evolutions that correlate to the MR signal to within a correlation threshold.

8. The method of claim 6, where the plurality of values for the second NMR parameter includes an entry for a correlation between every member of the set of comparative signal evolutions and the MR signal.

9. The method of claim 7, where the plurality of values for the second NMR parameter only includes entries for members of the set of comparative signal evolutions that correlate to the MR signal to within a correlation threshold.

10. The method of claim 1, comprising:
producing the set of comparative signal evolutions from one or more of, a previously acquired signal evolution, and a simulated signal evolution.

11. The method of claim 10, comprising:
producing the set of comparative signal evolutions to have a desired coverage threshold.

12. The method of claim 1, comprising:
comprising controlling an NMR apparatus to cause the NMR excitation in the item in response to an inversion recovery true fast imaging with steady state precession (IR-TrueFISP) excitation, and
completing the method, including computing the value for at least one of the two or more NMR parameters, in less than 5 seconds per slice of the item.

13. A nuclear magnetic resonance (NMR) apparatus, comprising:
a data store configured to store a set of relaxometry dictionary entries, where a relaxometry dictionary entry is a function of NMR parameters and an NMR excitation scheme;
an acquisition logic configured to acquire a noisy MR signal from an item that was subjected to IR-TrueFISP NMR excitation and that is experiencing NMR relaxation, where the noisy MR signal is produced by the NMR relaxation, and where the NMR relaxation is ace a function of two or more NMR parameters;
a correlation logic configured to determine a correlation between the noisy MR signal and a member of the set of relaxometry dictionary entries using a simultaneous multi-parameter orthogonal matching pursuit (OMP) between the noisy MR signal and members of the set of relaxometry dictionary entries; and
a parameter logic configured to compute a value for at least one of the two or more NMR parameters based on at least two correlations determined by the correlation logic, where the parameter logic is configured to compute the parameter value as the average of at least two correlations determined by the correlation logic.

14. The NMR apparatus of claim 13, where the two or more NMR parameters comprise one or more of, spin-lattice relaxation (T1), spin-spin relaxation (T2), spin density relaxation (M0), chemical shift, off-resonance, flow, perfusion, diffusion, motion, and uptake of biomarkers.

15. The NMR apparatus of claim 13, where the parameter logic is configured to compute the parameter value as the greatest of at least two correlations determined by the correlation logic.

16. The NMR apparatus of claim 13, comprising:
an excitation logic configured to produce the NMR excitation of the item.

17. A non-transitory computer-readable medium storing computer executable instructions that when executed by a computer control the computer to perform a method, the method comprising:
controlling a nuclear magnetic resonance (NMR) apparatus to cause selected nuclei in an item to resonate by applying radio frequency (RF) energy to the item;
controlling the NMR apparatus to acquire a first magnetic resonance (MR) image of the item;
controlling the NMR apparatus to acquire a second MR image of the object;
controlling the NMR apparatus to produce a signal evolution from the first MR image and the second MR image; and
controlling the NMR apparatus to characterize at least two types of NMR parameters of the selected nuclei in the item as a function of the resulting average of at least two correlations identified by a simultaneous multi-parametric orthogonal matching pursuit (OMP) comparison of the signal evolution and members of a set of comparative signal evolutions,
where the set of comparative signal evolutions has two or more members, and where members of the set of comparative signal evolutions are a function of two or more NMR parameters.

18. A method, comprising:
controlling a nuclear magnetic resonance (NMR) apparatus to cause NMR excitation in an item in response to an inversion recovery true fast imaging with steady state precession (IR-TrueFISP) excitation;
accessing data associated with a magnetic resonance (MR) signal produced during relaxation of nuclei in the item, where the MR signal is a function of two or more NMR parameters, including spin-lattice relaxation (T1), spin-spin relaxation (T2), spin density relaxation (M0), chemical shift, off-resonance, flow, perfusion, diffusion, motion, and uptake of biomarkers;
accessing data associated with a set of comparative signal evolutions, where a member of the set of comparative signal evolutions is determined by a function of N NMR parameters, N being an integer greater than one; and
computing a value for at least one of the two or more NMR parameters based on a combined correlation of the data associated with the MR signal to the data associated with the set of comparative signal evolutions,
where the combined correlation depends on at least two orthogonal matching pursuit (OMP) correlations between the data associated with the MR signal and two different members of the set of comparative signal evolutions,
the combined correlation comprising:
determining a set of values for a first NMR parameter from the two or more NMR parameters based on a first set of correlations between the MR signal and a subset of members of the set of comparative signal evolutions, where the set of values for the first NMR parameter only includes entries for members of the set of comparative signal evolutions that correlate to the MR signal to within a correlation threshold;
computing a combined correlation value for the first NMR parameter from the set of values for the first NMR parameter by taking the average of the set of values for the first NMR parameter;
determining a set of values for a second NMR parameter based on a second set of correlations between the MR signal and a subset of members of the set of comparative signal evolutions, where the set of values for the second NMR parameter only includes entries for members of the set of comparative signal evolutions that correlate to the MR signal to within a correlation threshold; and computing a combined correlation value for the second NMR parameter from the set of values for the second NMR parameter by taking the average of the set of values for the second NMR parameter.

19. A method, comprising:

accessing data associated with a magnetic resonance (MR) signal produced during relaxation of nuclei in an item that experienced nuclear magnetic resonance (NMR) excitation, where the MR signal is a function of two or more NMR parameters;

accessing data associated with a set of comparative signal evolutions, where a member of the set of comparative signal evolutions is determined by a function of N NMR parameters, N being an integer greater than one;

computing a value for at least one of the two or more NMR parameters based on a combined correlation of the data associated with the MR signal to the data associated with the set of comparative signal evolutions, where the combined correlation comprises determining a plurality of values for a first NMR parameter from the two or more NMR parameters based on a first plurality of correlations between the MR signal and a subset of members of the set of comparative signal evolutions and taking the average of the plurality of values for the first NMR parameter.

20. The method of claim 19, comprising:

determining a plurality of values for a second NMR parameter from the two or more NMR parameters based on a second plurality of correlations between the MR signal and the subset of members of the set of comparative signal evolutions; and computing a combined correlation value for the second NMR parameter from the plurality of values for the second NMR parameter by taking the average of the plurality of values for the second NMR parameter.

21. A method, comprising:

accessing data associated with a magnetic resonance (MR) signal produced during relaxation of nuclei in an item that experienced nuclear magnetic resonance (NMR) excitation, where the MR signal is a function of two or more NMR parameters;

accessing data associated with a set of comparative signal evolutions, where a member of the set of comparative signal evolutions is determined by a function of N NMR parameters, N being an integer greater than one;

computing a value for at least one of the two or more NMR parameters based on a combined correlation of the data associated with the MR signal to the data associated with the set of comparative signal evolutions;

computing a value for at least one of the two or more NMR parameters based on a combined correlation of the data associated with the MR signal to the data associated with the set of comparative signal evolutions, where the combined correlation comprises determining a plurality of values for a first NMR parameter from the two or more NMR parameters based on a first plurality of correlations between the MR signal and a subset of members of the set of comparative signal evolutions and taking the resulting average of the plurality of values for the first NMR parameter.

22. The method of claim 21, comprising:

determining a plurality of values for a second NMR parameter from the two or more NMR parameters based on a second plurality of correlations between the MR signal and the subset of members of the set of comparative signal evolutions; and computing a combined correlation value for the second NMR parameter from the plurality of values for the second NMR parameter by taking the resulting average of the plurality of values for the second NMR parameter.

23. A nuclear magnetic resonance (NMR) apparatus, comprising:

a data store configured to store a set of relaxometry dictionary entries, where a relaxometry dictionary entry is a function of two or more NMR parameters and an NMR excitation scheme;

an acquisition logic configured to acquire a noisy MR signal from an item that was subjected to IR-TrueFISP NMR excitation and that is experiencing NMR relaxation, where the noisy MR signal is produced by the NMR relaxation, and where the NMR relaxation is a function of two or more NMR parameters;

a correlation logic configured to determine a correlation between the noisy MR signal and a member of the set of relaxometry dictionary entries using a simultaneous multi-parameter orthogonal matching pursuit (OMP) between the noisy MR signal and members of the set of relaxometry dictionary entries; and a parameter logic configured to compute a value for at least one of the two or more NMR parameters based on at least two correlations determined by the correlation logic, where the parameter logic is configured to compute the parameter value as the resulting average of at least two correlations determined by the correlation logic.

* * * * *

UNITED STATES PATENT AND TRADEMARK OFFICE
CERTIFICATE OF CORRECTION

| | | |
|---|---|---|
| PATENT NO. | : 8,773,129 B2 | Page 1 of 1 |
| APPLICATION NO. | : 13/085753 | |
| DATED | : July 8, 2014 | |
| INVENTOR(S) | : Griswold et al. | |

It is certified that error appears in the above-identified patent and that said Letters Patent is hereby corrected as shown below:

In the Claims:

Column 15, line 38, delete "is ace a" and insert --is a--.

Signed and Sealed this
Seventh Day of October, 2014

Michelle K. Lee
*Deputy Director of the United States Patent and Trademark Office*